US008729689B2

(12) United States Patent
Hwang et al.

(10) Patent No.: US 8,729,689 B2
(45) Date of Patent: May 20, 2014

(54) STACKED SEMICONDUCTOR PACKAGE

(75) Inventors: Chul Kyu Hwang, Gimhae-si (KR);
Hyun Woo Lee, Cheonan-si (KR)

(73) Assignee: Hana Micron Inc.,
Chungcheongnam-do (KR)

( * ) Notice: Subject to any disclaimer, the term of this patent is extended or adjusted under 35 U.S.C. 154(b) by 0 days.

(21) Appl. No.: 13/697,288

(22) PCT Filed: May 11, 2011

(86) PCT No.: PCT/KR2011/003468
§ 371 (c)(1),
(2), (4) Date: Jan. 3, 2013

(87) PCT Pub. No.: WO2011/142582
PCT Pub. Date: Nov. 17, 2011

(65) Prior Publication Data
US 2013/0119558 A1    May 16, 2013

(30) Foreign Application Priority Data
May 10, 2010    (KR) .......................... 10-2010-0043637

(51) Int. Cl.
*H01L 23/02*    (2006.01)
(52) U.S. Cl.
USPC .................. 257/686; 257/777; 257/E25.006; 257/E25.021; 257/E25.027; 257/E23.085
(58) Field of Classification Search
USPC .................. 257/666, 777, E25.006, E25.013, 257/E25.021, E25.027, E23.085; 438/109, 438/FOR. 366, FOR. 426
See application file for complete search history.

(56) References Cited

U.S. PATENT DOCUMENTS

| 5,646,446 | A  | * | 7/1997  | Nicewarner et al. | ........... 257/723 |
| 6,208,521 | B1 | * | 3/2001  | Nakatsuka | ..................... 361/749 |
| 6,507,106 | B1 | * | 1/2003  | Hogerl | ........................... 257/723 |
| 7,149,095 | B2 | * | 12/2006 | Warner et al. | .................. 361/803 |
| 8,525,322 | B1 | * | 9/2013  | Kim et al. | ..................... 257/691 |

FOREIGN PATENT DOCUMENTS

| JP | 07-014939 A    | 1/1995  |
| JP | 2001-217388 A  | 8/2001  |
| JP | 2002-033442 A  | 1/2002  |
| JP | 2005-539403 A  | 12/2005 |
| KR | 1020070009776 A | 1/2007 |
| KR | 1020070045970 A | 5/2007 |

* cited by examiner

*Primary Examiner* — Jasmine Clark
(74) *Attorney, Agent, or Firm* — Reinhart Boerner Van Deuren P.C.

(57) ABSTRACT

Provided is a stacked semiconductor package. The stacked semiconductor package of the present invention comprises: a substrate unit, which includes a connection substrate electrically connecting a first substrate having a contact pad and a second substrate having a contact pad; a first chip laminate at which a plurality of first semiconductor chips are stacked in multi-steps on the first substrate; a second chip laminate at which a plurality of second semiconductor chips are stacked in multi-steps on the second substrate; a first conductive wire which electrically connects a first bonding pad of the first semiconductor chip and the contact pad of the first substrate, a second conductive wire which electrically connects a second bonding pad of the second semiconductor chip and the contact pad of the second substrate, and a bonding unit which has a contact adhesive layer having a certain thickness, which is disposed between the first semiconductor chip in the top layer of the first chip laminate and the second semiconductor chip in the top layer of the second chip laminate, and which vertically stacks and bonds the first chip laminate and the second chip laminate.

22 Claims, 7 Drawing Sheets

STACKED SEMICONDUCTOR PACKAGE

TECHNICAL FIELD

The present invention relates to a stacked semiconductor package, and, more particularly, to a stacked semiconductor package in which the clearance height of a molding unit is essentially precluded to enable the package to be light, slim, short and small, and which may minimize chip movement due to an external force upon wire bonding, may prevent cracking, may reduce the usage of wires upon wire bonding and the length of time required for wire bonding, and may maximally utilize the limited mounting space to thus reduce the size and volume of a package product.

BACKGROUND ART

With the recent advancement of the semiconductor industry and the various demands of users, electronic devices are manufactured to be much smaller and lighter, and to have larger capacities and perform multiple functions, and techniques for packaging semiconductor chips used in such electronic devices are intended to form the same or different semiconductor chips into a single unit package depending on the needs.

Chipscale packages wherein the size of a semiconductor package is about 110~120% of the size of a semiconductor chip or die and stacked semiconductor packages comprising a plurality of semiconductor chips stacked to increase the data capacity and the processing speed of the semiconductor devices have been developed.

In the case of a stacked semiconductor package comprising a plurality of semiconductor chips which are stacked, high technology for connecting bonding pads of stacked semiconductor chips and contact pads of a substrate using conductive wires is required.

Thus, to increase data capacity and processing speed by stacking more semiconductor chips in a limited space, the thickness of semiconductor chips has become thinner, and thereby semiconductor chips these days have a thickness of 50~100 μm.

FIG. 7 illustrates a conventional stacked semiconductor package. The conventional stacked semiconductor package 1 includes a first cascade chip laminate 20 configured such that a plurality of semiconductor chips 21 is obliquely stacked in a stepped shape on a substrate 10 and bonding pads 22 are thus externally exposed to one side of the top of each of the chips, and a second cascade chip laminate 30 configured such that a plurality of semiconductor chips 31 is obliquely stacked in a stepped shape in the opposite direction on the first cascade chip laminate 20 and thus bonding pads 32 are externally exposed to the other side of the top of each of the chips. The bonding pads 22, 32 of the semiconductor chips 21, 31 of the first and second cascade chip laminates 20, 30 are wire-bonded to contact pads 12, 13 provided on the upper surface of the substrate 10 by means of a plurality of conductive wires 23, 33, and a molding unit 50 is provided using a resin on the substrate 10.

In FIG. 7, the reference numeral 14 designates solder balls provided on the lower surface of the substrate.

However, the conventional stacked semiconductor package 1 is problematic because, in the course of forming the molding unit 50 so as to include the loop of the conductive wire that connects the uppermost semiconductor chip and the substrate, a clearance height h of 2~300 μm should be ensured between the uppermost semiconductor chip 31 and the upper surface of the molding unit 50, and thus such a clearance height makes it difficult to reduce the size and volume of the package so as to carry out miniaturization design.

Also, in the course of bonding the bonding pads 32 of the semiconductor chips 31 obliquely stacked in a stepped shape on the first cascade chip laminate 20 to the contact pad 13 by means of the conductive wires 33, when an external force is applied to the bonding pads 32 exposed to one side of the top of each of the chips, there is no structure for supporting, from below, the first cascade chip laminate 20 protruding to the left side in the drawing, and thus bouncing is caused upon bonding, undesirably making it difficult to perform a precise wire bonding process, incurring poor bonding, and cracking adhesive layers 25, 35 of the stacked semiconductor chips.

Furthermore, because the bonding pads 22, 32 and the contact pads 12, 13 should be wire-bonded using the plurality of conductive wires 23, 33, the usage of wires and the length of time required for wire bonding may excessively increase, undesirably raising the manufacturing cost. Also, upon molding, a short may occur between loops due to sweeping of the wire-bonded conductive wires, resulting in poor products.

Moreover, in the case where an electronic part 40 such as a controller is mounted near the first cascade chip laminate 20, it should be disposed at the outside of the substrate due to the bonding region of the conductive wire used to wire-bond the semiconductor chip 21 and the contact pad 12, undesirably imposing limitations on reducing the size and volume of the package so as to carry out the miniaturization design.

DISCLOSURE

Technical Problem

Accordingly, the present invention has been made keeping in mind the above problems occurring in the related art, and an object of the present invention is to provide a stacked semiconductor package in which the clearance height of a molding unit is essentially precluded to enable the package to be light, slim, short and small, and which may minimize chip movement due to an external force upon wire bonding, may prevent cracking, may reduce the usage of wires upon wire bonding and the length of time required for wire bonding, and may maximally utilize the limited mounting space to thus reduce the size and volume of a package product.

Technical Solution

In order to accomplish the above object, the present invention provides a stacked semiconductor package, comprising a substrate unit, comprising a first substrate having a contact pad, a second substrate having a contact pad, and a connection substrate which connects the first substrate and the second substrate; a first chip laminate comprising a plurality of first semiconductor chips stacked on the first substrate; a second chip laminate comprising a plurality of second semiconductor chips stacked on the second substrate; a first conductive wire which electrically connects a bonding pad of each of the first semiconductor chips and the contact pad of the first substrate; a second conductive wire which electrically connects a bonding pad of each of the second semiconductor chips and the contact pad of the second substrate; and a bonding unit having a contact adhesive layer having a predetermined thickness disposed between an uppermost first semiconductor chip of the first chip laminate and an uppermost second semiconductor chip of the second chip laminate so that the first chip laminate and the second chip laminate are vertically stacked and bonded.

In addition, the present invention provides a stacked semiconductor package, comprising a substrate unit, comprising a first substrate having a contact pad, a second substrate having a contact pad, and a connection substrate which connects the first substrate and the second substrate; a first chip laminate comprising a plurality of first semiconductor chips stacked on the first substrate; a second chip laminate comprising a plurality of second semiconductor chips stacked on the second substrate; a first conductive wire which electrically connects a bonding pad of each of the first semiconductor chips and the contact pad of the first substrate; a second conductive wire which electrically connects a bonding pad of each of the second semiconductor chips and the contact pad of the second substrate; and a bonding unit having a contact adhesive layer having a predetermined thickness disposed between an upper surface of a first molding unit formed using a resin so as to embed the first chip laminate therein and a lower surface of a second molding unit formed using a resin so as to embed the second chip laminate therein so that the first molding unit and the second molding unit are vertically stacked and bonded.

Preferably, the connection substrate comprises a flexible substrate which enables flexural bending.

Preferably, the first chip laminate or the second chip laminate is provided in a cascade stack structure in which a plurality of semiconductor chips is stacked in a stepped shape tilted to one side or in a protruding stack structure in which a plurality of semiconductor chips is stacked so as to alternately protrude from both sides thereof.

Preferably, the first conductive wire or the second conductive wire comprises a single wire which simultaneously wire-bonds the contact pad of the first substrate or the second substrate and the plurality of first semiconductor chips or the plurality of second semiconductor chips.

Preferably, the first conductive wire or the second conductive wire comprises a plurality of wires which individually wire-bond the contact pad of the first substrate or the second substrate and the plurality of first semiconductor chips or the plurality of second semiconductor chips.

Preferably, at least one electronic part is mounted on a region of the first substrate or the second substrate corresponding to a face-down surface exposed to a lower surface of the first semiconductor chips or the second semiconductor chips.

More preferably, the electronic part is wire-bonded or flip-bonded to the first substrate or the second substrate.

Preferably, the first substrate or the second substrate includes at least one support, and an upper end of the support is supported to the first semiconductor chip formed on a lowermost first semiconductor chip or second semiconductor chip mounted on the first substrate or the second substrate.

More preferably, the support comprises an elastic material or a thermally conductive material.

Preferably, a molding unit is provided between the first substrate and the second substrate so that the first chip laminate, the second chip laminate and the connection substrate are protected from an external environment.

Preferably, a molding unit is provided between the first substrate and the second substrate, and includes a third molding unit integratedly connected to the first molding unit and the second molding unit so that the connection substrate is protected from an external environment.

Preferably, the connection substrate includes at least one through-hole formed therein.

Advantageous Effects

According to the present invention, a first chip laminate and a second chip laminate are respectively provided on a first substrate and a second substrate which are electrically connected by means of a connection substrate, and pluralities of first and second semiconductor chips are wire-bonded using first and second conductive wires. Furthermore, the first chip laminate and the second chip laminate are vertically stacked and bonded via a contact adhesive layer having a predetermined thickness disposed between the uppermost first semiconductor chip of the first chip laminate and the uppermost second semiconductor chip of the second chip laminate, and thereby a package can be manufactured without the need to ensure a clearance height of a molding unit in the upper region of the package, thus reducing the volume of the package, resulting in a smaller package.

Also, wire bonding between a plurality of semiconductor chips and a substrate can be performed using a single wire member, thus reducing the usage of wires upon wire bonding and the length of time required for wire bonding to thereby decrease the manufacturing cost and increase the price competitiveness. Moreover, a short can be prevented from occurring due to contact between wire-bonded loops.

Because an electronic part such as a controller can be mounted on one side which is not wire-bonded or on a clearance area of the semiconductor chip ensured by a support member, the limited mounting space of the package can be utilized maximally, thus reducing the size and volume of a package product.

Also, chip movement due to an external force caused by wire bonding can be minimized via the support member disposed between the first and second chip laminates and the substrate, thus preventing cracking of the adhesion portion between the chips, ultimately increasing the reliability and quality of a product.

MODE FOR INVENTION

Hereinafter, a detailed description will be given of the preferred embodiments of the present invention with reference to the appended drawings.

Figure 1:
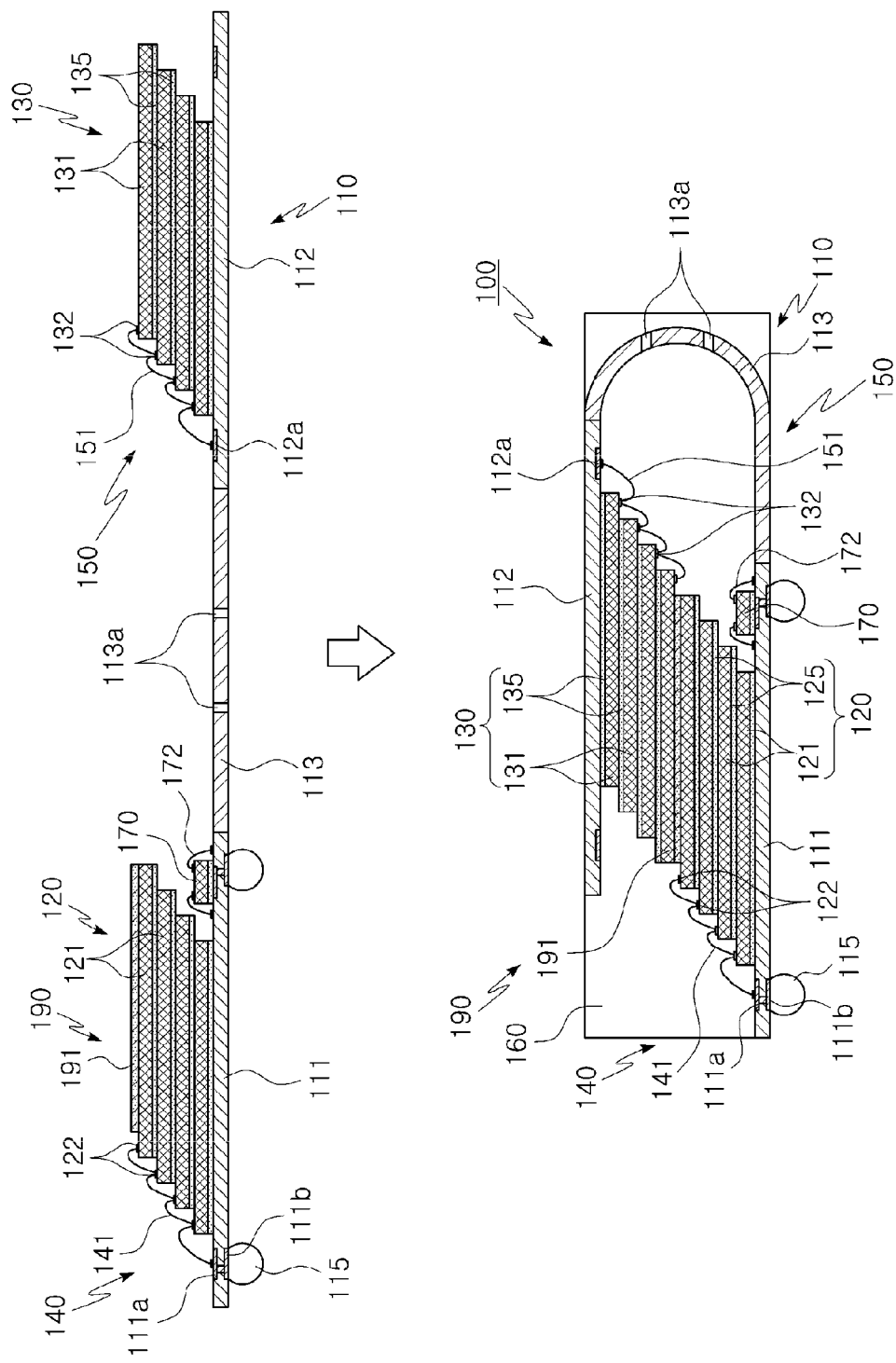
FIG. 1 is a cross-sectional view illustrating a stacked semiconductor package according to a first embodiment of the present invention.

According to a first embodiment of the present invention, as illustrated in FIG. 1, a stacked semiconductor package 100 includes a substrate unit 110, a first chip laminate 120, a second chip laminate 130, a first conductive wire 140, a second conductive wire 150, and a bonding unit 190.

The substrate unit 110 includes a first substrate 111, a second substrate 112, and a connection substrate 113 which connects these substrates.

The first substrate 111 includes a contact pad 111a formed which is wire-bonded with the end of the first conductive wire 140 on the upper surface thereof, and external terminals 111b such as ball lands to form solder balls 115 on the lower surface thereof.

Thus, the first substrate 111 may be mounted on a main board via the solder balls 115 applied on the external terminals 111b.

The second substrate 112 includes a contact pad 112a which is wire-bonded with the end of the second conductive wire 150, as in the first substrate.

Herein, the external terminals 111b are illustratively explained to be formed on the lower surface of the first substrate, but the present invention is not limited thereto, and they may be formed on the lower surface of the second substrate.

The connection substrate 113 is composed of a substrate member having a predetermined length which electrically connects the first substrate 111 and the second substrate 112, and such a connection substrate 113 preferably includes a flexible substrate so as to enable free flexural bending upon vertical stacking of the first chip laminate 120 and the second chip laminate 130.

Also, the connection substrate 113 preferably has at least one through-hole 113a through which a resin may pass efficiently upon forming the molding unit.

As such, the first substrate 111 and the second substrate 112 have a pattern circuit on the upper surfaces thereof, and solder balls 115 applied on ball lands on the lower surfaces thereof so as to be electrically connected to a main board (not shown), and thereby may be provided as a printed circuit board which may be mounted on the main board.

The first chip laminate 120 includes a plurality of first semiconductor chips 121 stacked in two or more layers on the first substrate 111, and the plurality of semiconductor chips 121 may be stacked in a stepped shape tilted to one side which is the right side in the drawing and may thus be provided in the form of a cascade stack structure.

Thus, the plurality of first semiconductor chips 121 is stacked in a stepped shape so that the first bonding pads 122 are externally exposed via face-up surfaces exposed to one side of the top of each thereof by means of an adhesive layer 125 having a predetermined thickness.

The second chip laminate 130 includes a plurality of second semiconductor chips 131 stacked in two or more layers on the second substrate 112, as in the first chip laminate 120, and the plurality of second semiconductor chips 131 may be stacked in a stepped shape tilted to one side which is the right side in the drawing and may thus be provided in the form of a cascade stack structure.

Accordingly, the plurality of second semiconductor chips 131 is stacked in a stepped shape so that the second bonding pads 132 are externally exposed via face-up surfaces exposed to one side of the top of each thereof by means of an adhesive layer 135 having a predetermined thickness.

Although the first chip laminate 120 and the second chip laminate 130 are illustratively explained such that the plurality of first semiconductor chips 121 and the plurality of second semiconductor chips 131 are provided as a cascade stack structure in a stepped shape tilted in the same direction, the present invention is not limited thereto, and they may be provided as a stack structure in the different directions.

The first and second semiconductor chips 121, 131 may include any one selected from among memory chips such as SRAM and DRAM, digital integrated circuit chips, RF integrated circuit chips, and base band chips, depending on the type of setting device to which the package is applied.

The first conductive wire 140 is composed of a wire member having a predetermined length connected between the first bonding pads 122 externally exposed to the face-up surface of one side of the top of each first semiconductor chip 121 and the contact pad 111a formed on the upper surface of the first substrate 111 so that the first semiconductor chips 121 of the first chip laminate 120 are electrically connected to the first substrate 110.

The second conductive wire 150 is composed of a wire member having a predetermined length connected between the second bonding pads 132 externally exposed to the face-up surface of one side of the top of each second semiconductor chip 121 and the second contact pad 112a formed on the upper surface of the second substrate 112 so that the second semiconductor chips 131 of the second chip laminate 130 are electrically connected to the second substrate 112.

The bonding unit 190 has a contact adhesive layer 191 having a predetermined thickness positioned between the uppermost first semiconductor chip among the plurality of first semiconductor chips 121 multilayered to form the first chip laminate 120 and the uppermost second semiconductor chip among the plurality of second semiconductor chips 131 multilayered to form the second chip laminate 130, whereby the first chip laminate 120 and the second chip laminate 130 are vertically bonded, so that the first chip laminate 120 mounted on the first substrate 111 and the second chip laminate 130 mounted on the second substrate 112 are integratedly bonded so as to be positioned as a lower structure and an upper structure, respectively.

Herein, the contact adhesive layer 191 is illustratively explained to be provided on the upper surface of the uppermost first semiconductor chip 121 of the first chip laminate 120 but the present invention is not limited thereto, and it may be provided on the upper surface of the uppermost second semiconductor chip 131 of the second chip laminate 130.

The contact adhesive layer 191 may be made of double-sided tape having a predetermined thickness attached to the outer surface of the semiconductor chip or an adhesive applied to a predetermined thickness on the outer surface of the semiconductor chip.

Also, a molding unit 160, which is made of a resin sealing material such as an epoxy molding compound, is provided between the first substrate 111 and the second substrate 112, to cover the first chip laminate 120, the second chip laminate 130, the connection substrate 113, and the first and second conductive wires 140, 150 so as to protect them from an external environment such as corrosion or external physical damage, thereby forming a single package.

As such, the connection substrate 160 is preferably embedded in the molding unit 160 so as not to be externally exposed, and the lower surface of each of the first substrate 111 and the second substrate 112 is preferably provided so as to externally expose the external terminals via the molding unit 160.

Figure 2:
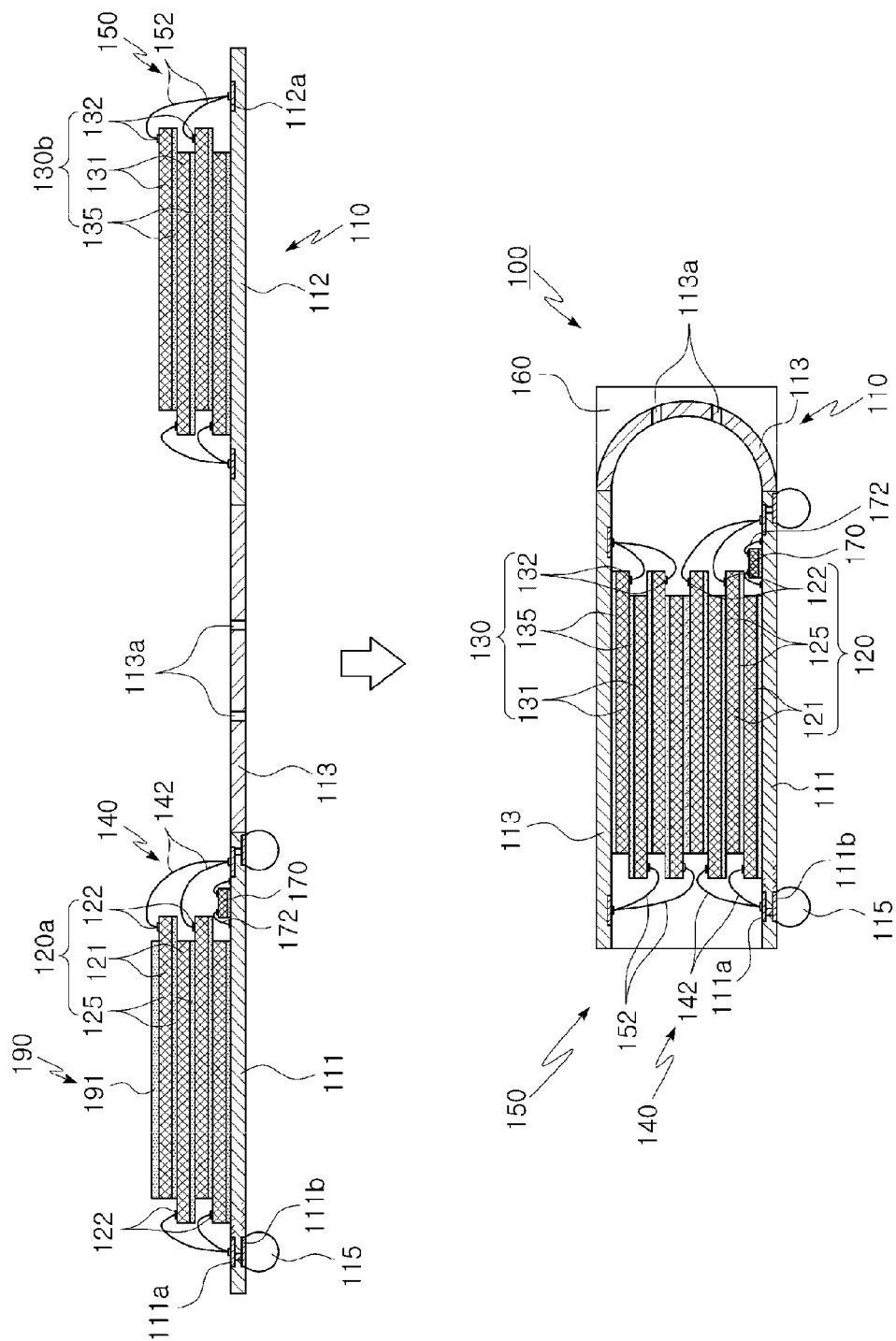
FIG. 2 is a cross-sectional view illustrating a stacked semiconductor package according to a second embodiment of the present invention.

Meanwhile, as illustrated in FIG. 2, a first chip laminate 120a formed on the first substrate 111 and a second chip laminate 130a formed on the second substrate 112 may be provided in the form of a protruding stack structure wherein each of a plurality of first semiconductor chips 121 and a plurality of second semiconductor chips 131 is stacked in such a manner that the semiconductor chips are alternately protruded from both sides thereof.

Thus, as the plurality of first semiconductor chips 121 and the plurality of second semiconductor chips 131 are stacked in a protruding stack structure by means of adhesive layers 125, 135 having a predetermined thickness, they are stacked in a stepped shape so that first and second bonding pads 122, 132 are externally exposed via the face-up surfaces exposed alternately to the both sides thereof.

The first and second bonding pads 122, 132 are respectively wire-bonded with contact pads 111a, 112a formed at both sides of the first and second chip laminates 120a, 130a of the first and second substrates 111, 112 by means of the first and second conductive wires 140, 150.

Herein, the same number of first and second semiconductor chips of the first and second chip laminates 120, 120a, 130, 130a are illustratively explained to be stacked, but the present invention is not limited thereto, and the different numbers thereof may be stacked.

On the other hand, as illustrated in FIG. 1, the first conductive wire 140 wire-bonded to the contact pad 111a of the first substrate 111 or the second conductive wire 150 wire-bonded to the contact pad 112a of the second substrate 112 may be composed of a single wire member 141, 151 which simultaneously wire-bonds the contact pads 111a, 112a and the plurality of first semiconductor chips 121 or the plurality of second semiconductor chips 131.

The first and second conductive wires 140, 150 include single wire members 141, 151 used in such a manner that one end of the wire member is wire-bonded to the bonding pad of the uppermost semiconductor chip among the pluralities of first and second semiconductor chips 121, 131 of the first and second chip laminates and the other end thereof is wire-bonded to the contact pads 111a, 112a of the first and second substrates 111, 112, and then the middle portion thereof is continuously wire-bonded to the bonding pad of the lower semiconductor chip by a wire bonding jig for generating heat upon power supply.

In this case, the height of the loops of the first and second conductive wires which wire-bond the first and second substrates 111, 112 and the first and second semiconductor chips 121, 131 is lowered, thus reducing the total height of the package so as to enable the miniaturization design and decreasing the usage of wires and the length of time required for wire bonding.

Figure 3:
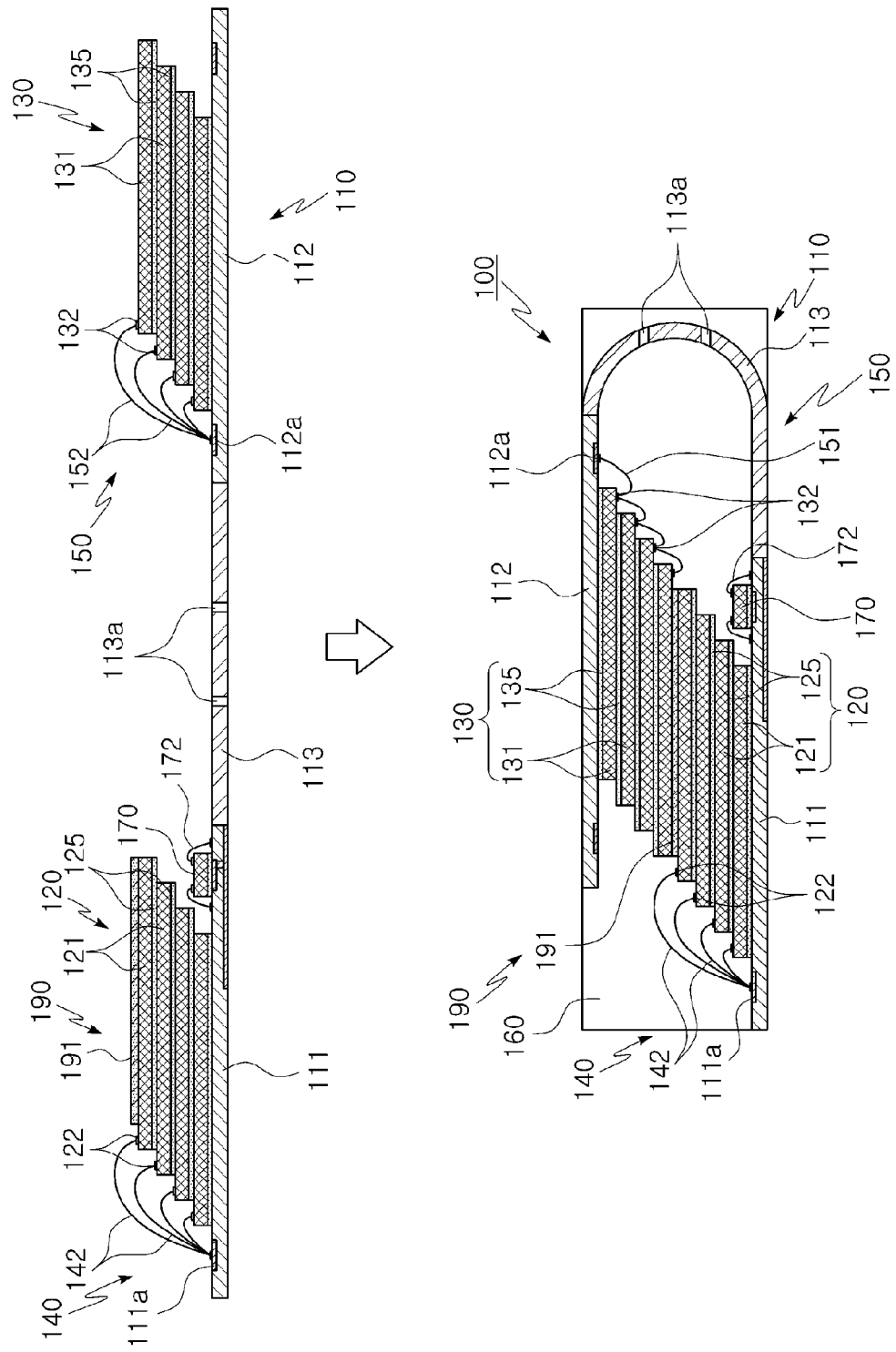
FIG. 3 is a cross-sectional view illustrating a stacked semiconductor package according to a third embodiment of the present invention.

Also, as illustrated in FIG. 3, the first conductive wire 140 wire-bonded to the first contact pad 111 or the second conductive wire 150 wire-bonded to the contact pad 112 may be composed of a plurality of wire members 142, 152 which individually wire-bond the contact pads 111a, 112a of the first and second substrates 111, 112 to the plurality of first semiconductor chips 121 or the plurality of second semiconductor chips 131.

The first and second conductive wires 140, 150 are composed of pluralities of wire members 142, 152 used in such a manner that one end of each of the wire members is wire-bonded to the first and second bonding pads 122, 132 of the first and second semiconductor chips 121, 131 of the first and second chip laminates 120, 130 and the other end of each thereof is then wire-bonded to the contact pad 111a of the first substrate 111 and the contact pad 112a of the second substrate.

Herein, the first conductive wire 140 and the second conductive wire 150 are illustratively explained to be provided in a wire bonding manner of the same type using the single wire member 141, 151 or the plurality of wire members 142, 152, but the present invention is not limited thereto, and they may be provided in a wire bonding manner of different types in which any one of the first and second conductive wires is wire-bonded with the single wire member 141, 151 and the other one may be wire-bonded with the plurality of wire members 142, 152.

In the case where the first chip laminate 120 and the second chip laminate 130 are provided in a cascade stack structure in which the semiconductor chips 121, 131 are stacked in a stepped shape tilted to one side, as illustrated in FIGS. 1 and 3, an electronic part 170 such as a controller may be mounted by means of a third conductive wire 172 on the first substrate 111 or the second substrate 112 corresponding to the face-down surface exposed to the lower surface of the first semiconductor chip 121 or the second semiconductor chip 131.

Such an electronic part 170 is wire-bonded by means of the third conductive wire 172 in a space defined between the first chip laminate 120 having a cascade stack structure and the first substrate 111, or in a space defined between the second chip laminate 130 having a cascade stack structure and the second substrate 112, thus increasing space usability of the package having a limited volume to ensure the miniaturization of a package.

Herein, the electronic part 170 is illustratively explained to be wire-bonded on the first substrate 111 or the second substrate 112 by the third conductive wire 172, but the present invention is not limited thereto, and it may be flip-bonded.

Figure 4:
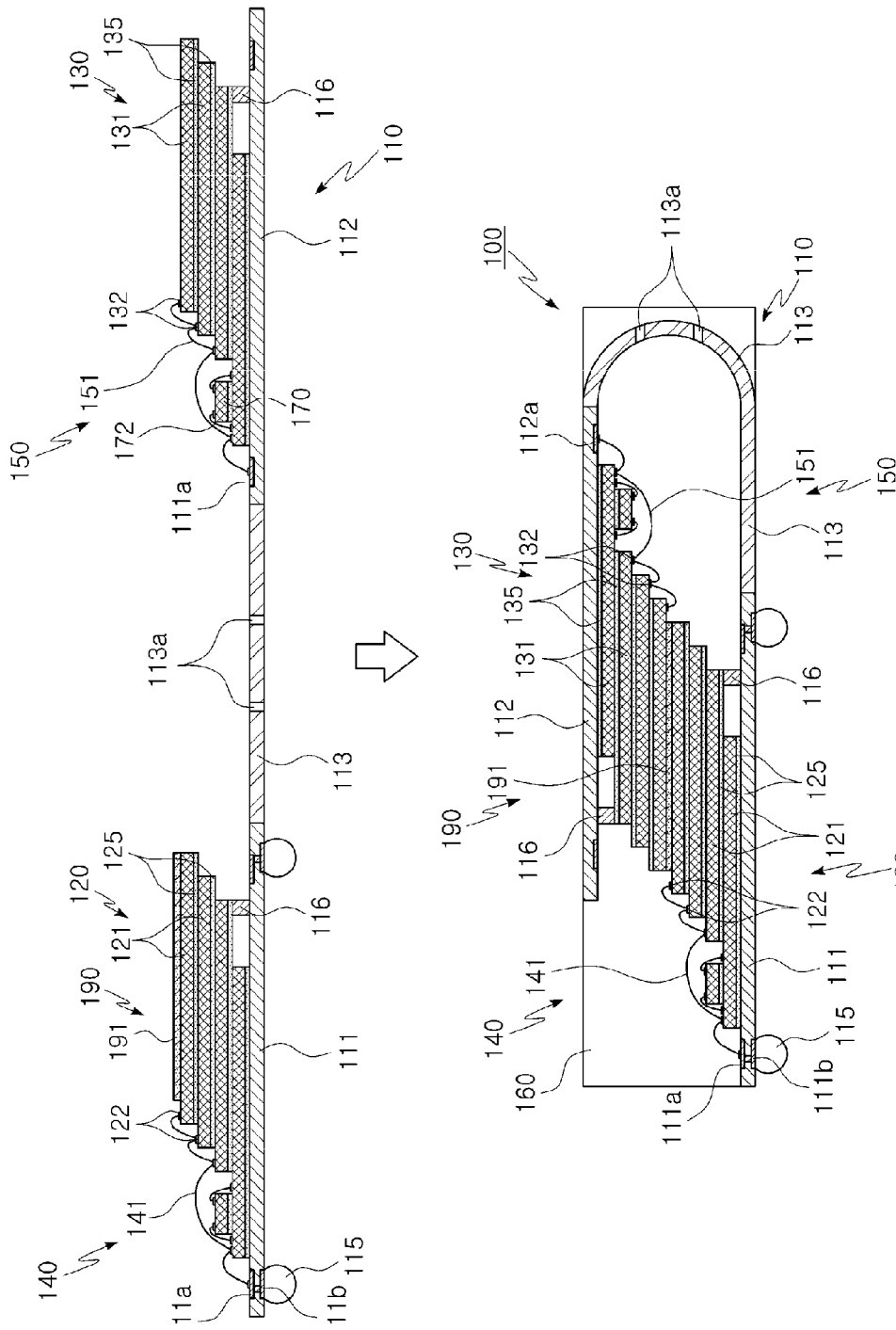
FIG. 4 is a cross-sectional view illustrating a stacked semiconductor package according to a fourth embodiment of the present invention.

In the case where the first chip laminate 120 and the second chip laminate 130 are provided in a cascade stack structure in which the pluralities of semiconductor chips 121, 131 are stacked in a stepped shape tilted to one side, as illustrated in FIG. 4, the first substrate 111 or the second substrate 112 includes at least one support 116.

The support 116 is composed of a column member disposed outside the first and second substrates 111, 112 so that the upper end thereof is in contact with the lower surface of any one semiconductor chip among the pluralities of first and second semiconductor chips formed on the lowermost first and second semiconductor chips 121, 131 on the first and second substrates 111, 112.

The support 116 is made of an elastic material such as a resin so as to elastically support an eccentric load of the first and second chip laminates 120 stacked in a stepped shape tilted to one side, or of a thermally conductive material such as aluminum, copper, etc. having high thermal conductivity so as to guide heat generated from the chips upon driving of the semiconductor chips to the first and second substrates 111, 112 so as to dissipate it.

Also, the support 116 may be provided at a comparatively shorter length than the length corresponding to the face-down surfaces of the first and second semiconductor chips 121, 131 externally exposed corresponding to the first and second substrates 111, 112 so as to form a space having a predetermined size between the first substrate 111 and the second chip laminate 120 and between the second substrate 112 and the second chip laminate 130, or may be provided at the same length as the length corresponding to the face-down surfaces of the first and second semiconductor chips 121, 131 externally exposed corresponding to the first and second substrates 111, 112 so as to fill the space by the support.

Meanwhile, in the first chip laminate 120 and the second chip laminate 130, an electronic part 170 such as a controller may be mounted by means of the third conductive wire 172 on the face-up surface exposed to the top of any one chip among the pluralities of first and second semiconductor chips 121, 131 externally protruded by the support 116.

This is because the first and second semiconductor chips 121, 131 including the lowermost chips each having one end supported by the support 116 are protruded at a predetermined length from the first and second chip laminates 120, 130 to the outside in a direction pointing away from the support due to the support force of the support 116, whereby the exposed area of the face-up surfaces on which the first and second bonding pads 122, 132 are formed may be increased so as to be adapted for mounting the electronic part 170.

Herein, the electronic part 170 is illustratively explained to be wire-bonded on the face-up surface of the first and second semiconductor chips 121, 131 by the third conductive wire 172, but the present invention is not limited thereto, and it may be flip-bonded.

Figure 5:
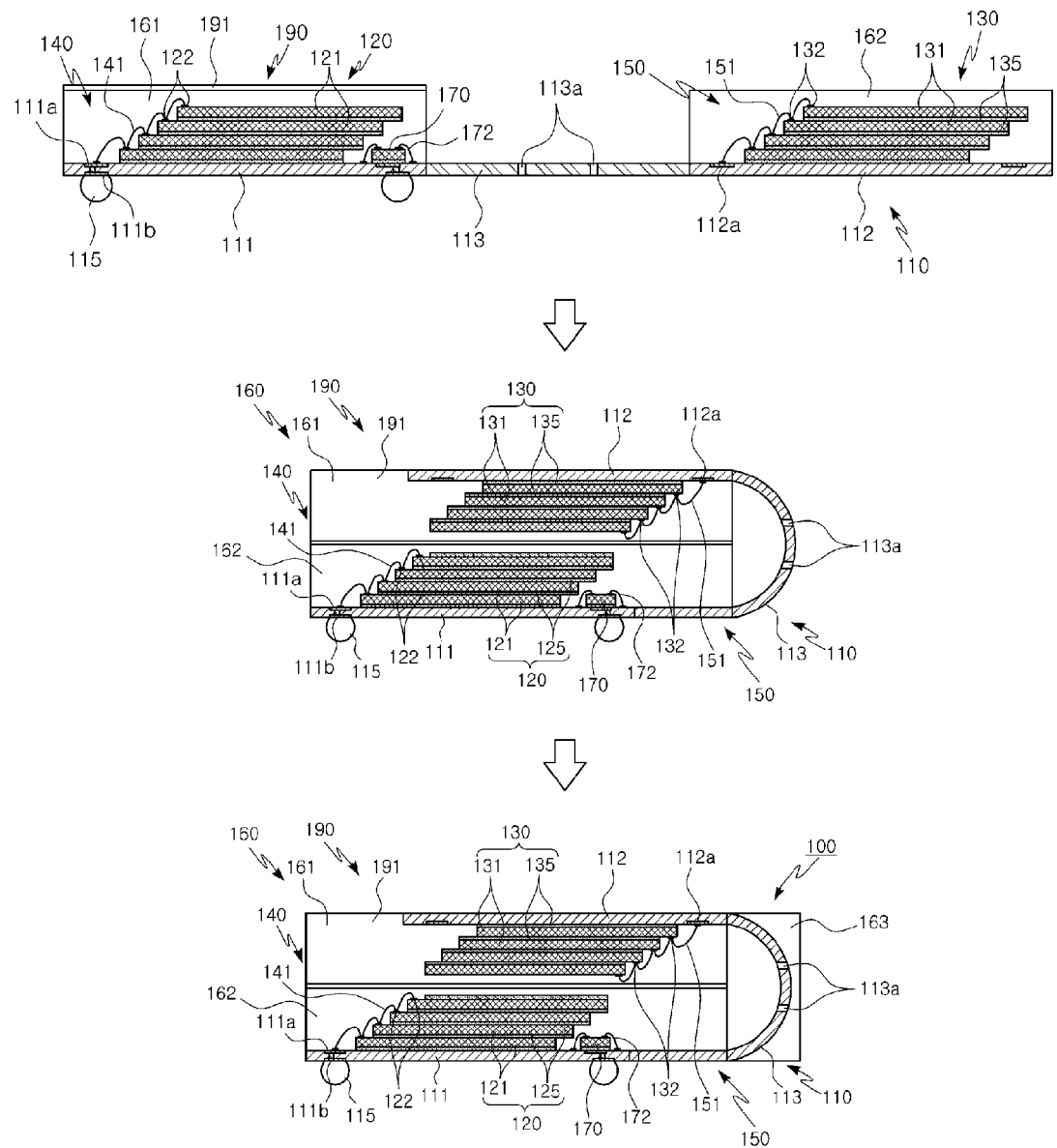
FIG. 5 is a cross-sectional view illustrating the stacked semiconductor package according to the third embodiment of the present invention.
Figure 6:
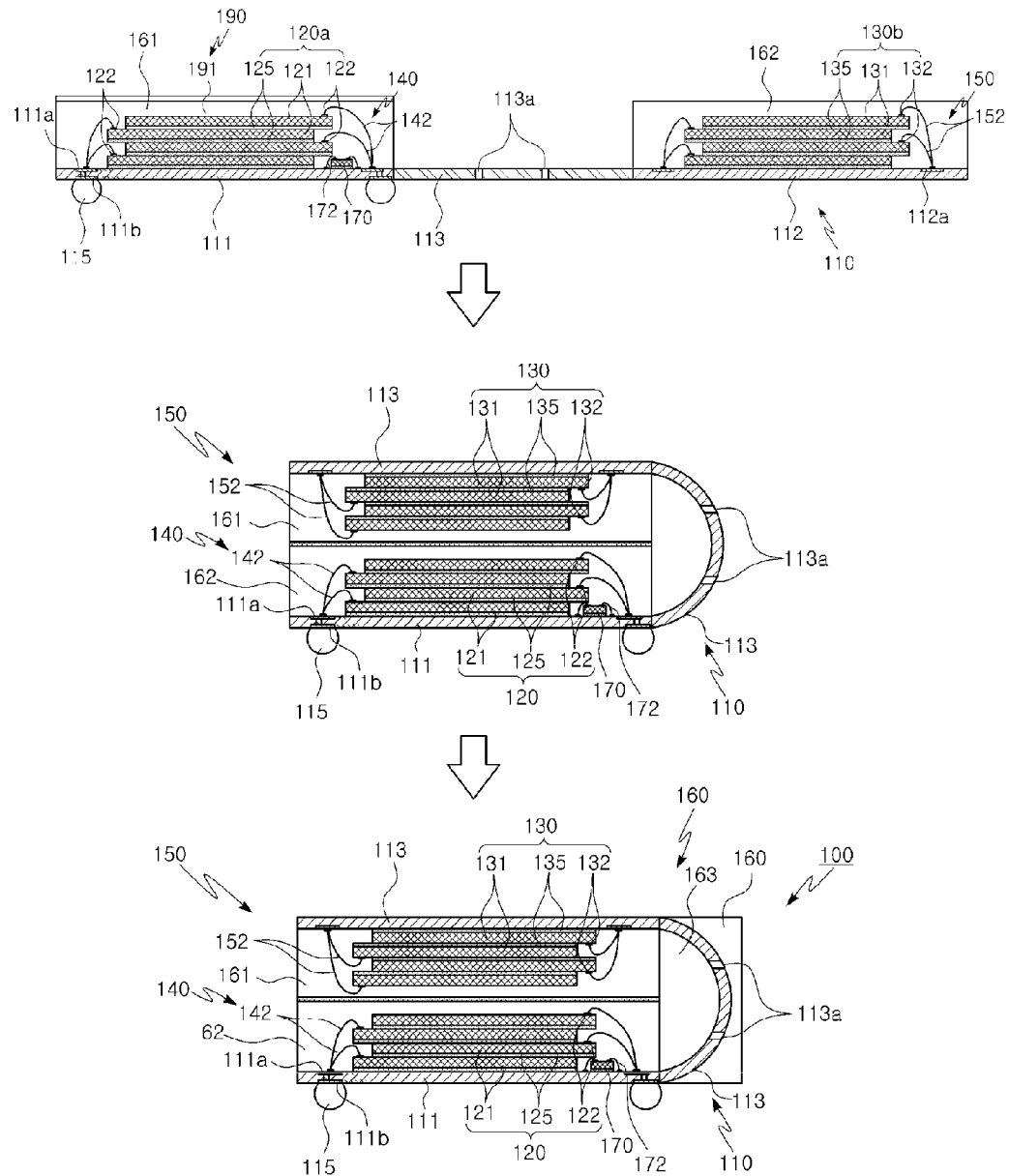
FIG. 6 is a cross-sectional view illustrating the stacked semiconductor package according to the fourth embodiment of the present invention.
Figure 7:
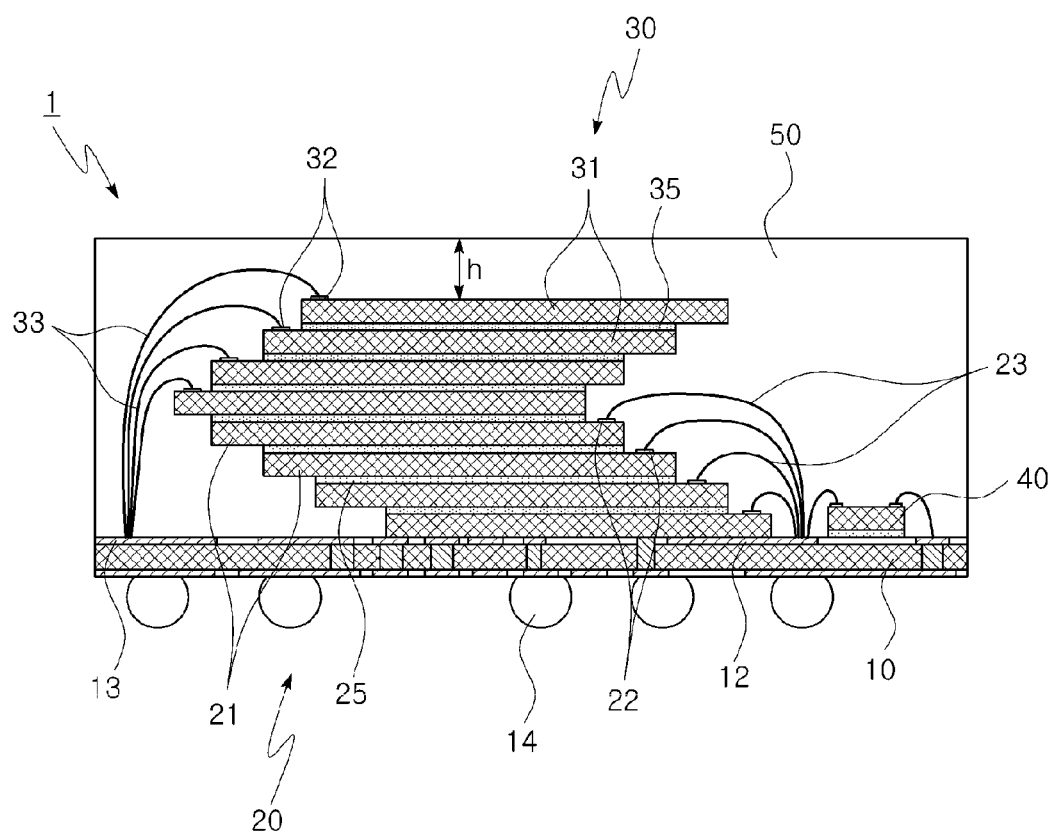
FIG. 7 is a cross-sectional view illustrating a conventional stacked semiconductor package.

As illustrated in FIGS. 5 and 6, the bonding unit 190 includes a contact adhesive layer 191 having a predetermined thickness positioned between a first molding unit 161 formed using a resin on the first substrate 111 to protect the first chip laminate 120, 120a from an external environment, and a second molding unit 161 formed using a resin on the second substrate 112 to protect the second chip laminate 130, 130a from an external environment, whereby the first molding unit 161 and the second molding unit 162 are vertically bonded, and thus the first molding unit 161 including the first chip laminate 120, 120a formed on the first substrate 111 and the second molding unit 162 including the second chip laminate 130, 130a formed on the second substrate 112 are integratedly bonded so as to be positioned as a lower structure and an upper structure, respectively.

Herein, the contact adhesive layer 191 is illustratively explained to be formed on the upper surface of the first molding unit 161, but the present invention is not limited thereto, and it may be formed on the upper surface of the second molding unit 162.

After vertical bonding of the first and second molding units 161, 162, the connection substrate 113 which connects the first substrate 111 and the second substrate 112 is externally exposed to one side of the first and second molding units 161, 162, and the exposed connection substrate 113 is molded using a resin so as to protect it from an external environment in a state of the first and second molding units 161, 162 being vertically bonded, thereby forming a third molding unit 163 which is integrated with the first and second molding units 161, 162.

Thus, provided between the first substrate 111 and the second substrate 112 is the molding unit 160 comprising the first molding unit 161 which covers and protects the first chip laminate 120, 120a and the first conductive wire 140, the second molding unit 162 which covers and protects the second chip laminate 130, 130a and the second conductive wire 150, and the second molding unit 163 formed to cover and protect the connection substrate 113, thereby forming a single package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A stacked semiconductor package, comprising:
a substrate unit, comprising a first substrate having a contact pad, a second substrate having a contact pad, and a connection substrate which connects the first substrate and the second substrate;
a first chip laminate comprising a plurality of first semiconductor chips stacked on the first substrate;
a second chip laminate comprising a plurality of second semiconductor chips stacked on the second substrate;
a first conductive wire which electrically connects a bonding pad of each of the first semiconductor chips and the contact pad of the first substrate;
a second conductive wire which electrically connects a bonding pad of each of the second semiconductor chips and the contact pad of the second substrate; and
a bonding unit having a contact adhesive layer having a predetermined thickness disposed between an uppermost first semiconductor chip of the first chip laminate and an uppermost second semiconductor chip of the second chip laminate so that the first chip laminate and the second chip laminate are vertically stacked and bonded.

2. The stacked semiconductor package of claim 1, wherein the connection substrate comprises a flexible substrate which enables flexural bending.

3. The stacked semiconductor package of claim 1, wherein the first chip laminate or the second chip laminate is provided in a cascade stack structure in which a plurality of semiconductor chips is stacked in a stepped shape tilted to one side or in a protruding stack structure in which a plurality of semiconductor chips is stacked so as to alternately protrude from both sides thereof.

4. The stacked semiconductor package of claim 1, wherein the first conductive wire or the second conductive wire comprises a single wire which simultaneously wire-bonds the contact pad of the first substrate or the second substrate and the plurality of first semiconductor chips or the plurality of second semiconductor chips.

5. The stacked semiconductor package of claim 1, wherein the first conductive wire or the second conductive wire comprises a plurality of wires which individually wire-bond the contact pad of the first substrate or the second substrate and the plurality of first semiconductor chips or the plurality of second semiconductor chips.

6. The stacked semiconductor package of claim 1, wherein at least one electronic part is mounted on a region of the first substrate or the second substrate corresponding to a face-down surface exposed to a lower surface of the first semiconductor chips or the second semiconductor chips.

7. The stacked semiconductor package of claim 1, wherein the electronic part is wire-bonded or flip-bonded to the first substrate or the second substrate.

8. The stacked semiconductor package of claim 1, wherein the first substrate or the second substrate includes at least one support, and an upper end of the support is supported to the first semiconductor chip formed on a lowermost first semiconductor chip or second semiconductor chip mounted on the first substrate or the second substrate.

9. The stacked semiconductor package of claim 8, wherein the support comprises an elastic material or a thermally conductive material.

10. The stacked semiconductor package of claim 1, wherein a molding unit is provided between the first substrate and the second substrate so that the first chip laminate, the second chip laminate and the connection substrate are protected from an external environment.

11. The stacked semiconductor package of claim 10, wherein the connection substrate includes at least one through-hole formed therein.

12. A stacked semiconductor package, comprising:
a substrate unit, comprising a first substrate having a contact pad, a second substrate having a contact pad, and a connection substrate which connects the first substrate and the second substrate;
a first chip laminate comprising a plurality of first semiconductor chips stacked on the first substrate;
a second chip laminate comprising a plurality of second semiconductor chips stacked on the second substrate;

a first conductive wire which electrically connects a bonding pad of each of the first semiconductor chips and the contact pad of the first substrate;

a second conductive wire which electrically connects a bonding pad of each of the second semiconductor chips and the contact pad of the second substrate; and a bonding unit having a contact adhesive layer having a predetermined thickness disposed between an upper surface of a first molding unit formed using a resin so as to embed the first chip laminate therein and a lower surface of a second molding unit formed using a resin so as to embed the second chip laminate therein so that the first molding unit and the second molding unit are vertically stacked and bonded.

13. The stacked semiconductor package of claim 12, wherein the connection substrate comprises a flexible substrate which enables flexural bending.

14. The stacked semiconductor package of claim 12, wherein the first chip laminate or the second chip laminate is provided in a cascade stack structure in which a plurality of semiconductor chips is stacked in a stepped shape tilted to one side or in a protruding stack structure in which a plurality of semiconductor chips is stacked so as to alternately protrude from both sides thereof.

15. The stacked semiconductor package of claim 12, wherein the first conductive wire or the second conductive wire comprises a single wire which simultaneously wire-bonds the contact pad of the first substrate or the second substrate and the plurality of first semiconductor chips or the plurality of second semiconductor chips.

16. The stacked semiconductor package of claim 12, wherein the first conductive wire or the second conductive wire comprises a plurality of wires which individually wire-bond the contact pad of the first substrate or the second substrate and the plurality of first semiconductor chips or the plurality of second semiconductor chips.

17. The stacked semiconductor package of claim 12, wherein at least one electronic part is mounted on a region of the first substrate or the second substrate corresponding to a face-down surface exposed to a lower surface of the first semiconductor chips or the second semiconductor chips.

18. The stacked semiconductor package of claim 12, wherein the electronic part is wire-bonded or flip-bonded to the first substrate or the second substrate.

19. The stacked semiconductor package of claim 12, wherein the first substrate or the second substrate includes at least one support, and an upper end of the support is supported to the first semiconductor chip formed on a lowermost first semiconductor chip or second semiconductor chip mounted on the first substrate or the second substrate.

20. The stacked semiconductor package of claim 19, wherein the support comprises an elastic material or a thermally conductive material.

21. The stacked semiconductor package of claim 12, wherein a molding unit is provided between the first substrate and the second substrate, and includes a third molding unit integratedly connected to the first molding unit and the second molding unit so that the connection substrate is protected from an external environment.

22. The stacked semiconductor package of claim 21, wherein the connection substrate includes at least one through-hole formed therein.

* * * * *